(12) United States Patent
Thiem et al.

(10) Patent No.: US 8,889,476 B2
(45) Date of Patent: Nov. 18, 2014

(54) FORMULATIONS COMPRISING A MIXTURE OF ZNO CUBANES AND PROCESS USING THEM TO PRODUCE SEMICONDUCTIVE ZNO LAYERS

(75) Inventors: Heiko Thiem, Haltern am See (DE); Juergen Steiger, Duesseldorf (DE); Alexey Merkulov, Ludwigshafen (DE); Duy Vu Pham, Oberhausen (DE); Yilmaz Aksu, Berlin (DE); Stefan Schutte, Berlin (DE); Matthias Driess, Berlin (DE)

(73) Assignee: Evonik Degussa GmbH, Essen (DE)

( * ) Notice: Subject to any disclaimer, the term of this patent is extended or adjusted under 35 U.S.C. 154(b) by 888 days.

(21) Appl. No.: 13/123,072

(22) PCT Filed: Nov. 4, 2009

(86) PCT No.: PCT/EP2009/064584
§ 371 (c)(1),
(2), (4) Date: Apr. 7, 2011

(87) PCT Pub. No.: WO2010/057770
PCT Pub. Date: May 27, 2010

(65) Prior Publication Data
US 2011/0193084 A1    Aug. 11, 2011

(30) Foreign Application Priority Data
Nov. 18, 2008    (DE) .......... 10 2008 058 040

(51) Int. Cl.
*H01L 21/36*    (2006.01)
*C23C 18/12*    (2006.01)

(52) U.S. Cl.
CPC ......... *C23C 18/1216* (2013.01); *C23C 18/1223* (2013.01); *C23C 18/1245* (2013.01); *C23C 18/122* (2013.01); *C23C 18/1295* (2013.01)

USPC 438/104; 257/43; 257/E21.461; 257/E29.094

(58) Field of Classification Search
CPC ........................................... H01L 21/36
USPC .............. 438/104; 257/43, E21.461, E29.094
See application file for complete search history.

(56) References Cited

U.S. PATENT DOCUMENTS 4,999,435 A * 3/1991 Paradies ...................... 548/304.4
5,133,973 A * 7/1992 Paradies ........................ 424/450

(Continued)

FOREIGN PATENT DOCUMENTS

| JP | 7 182939 | 7/1995 |
| JP | 2008 88511 | 4/2008 |

OTHER PUBLICATIONS

Polarz, S. et al., "Preparation of High-Surface-Area Zinc Oxide with Ordered Porosity, Different Pore Sizes, and Nanocrystalline Walls", Chemistry A European Journal, vol. 13, pp. 592-597, XP002588232, (2007).

(Continued)

*Primary Examiner* — Marc Armand
(74) *Attorney, Agent, or Firm* — Oblon, Spivak, McClelland, Maier & Neustadt, L.L.P.

(57) ABSTRACT

The present invention relates to formulations comprising a) at least two different ZnO cubanes of which at least one ZnO cubane is present in solid form under SATP conditions and at least one ZnO cubane is present in liquid form under SATP conditions, and b) at least one solvent, to processes for producing semiconductive ZnO layers from these formulations, to the use of the formulations for producing electronic components and to the electronic components themselves.

22 Claims, 6 Drawing Sheets

(56) References Cited

U.S. PATENT DOCUMENTS

| | | |
|---|---|---|
| 2010/0132788 A1 | 6/2010 | Petrat et al. |
| 2011/0309313 A1 | 12/2011 | Steiger et al. |
| 2011/0315982 A1 | 12/2011 | Hoppe et al. |
| 2012/0181488 A1 | 7/2012 | Steiger et al. |
| 2012/0202318 A1 | 8/2012 | Steiger et al. |
| 2012/0213980 A1 | 8/2012 | Arning et al. |
| 2012/0289728 A1 | 11/2012 | Steiger et al. |
| 2013/0104773 A1 | 5/2013 | Steiger et al. |
| 2013/0116463 A1 | 5/2013 | Steiger et al. |
| 2013/0122647 A1 | 5/2013 | Steiger et al. |

OTHER PUBLICATIONS

Hikov, T. et al., "Preparation of ZnO Colloids by Pyrolysis of [MeZnO$^i$Pr]$_4$ in the Presence of Hexadecylamine and Probing the Surface Chemistry of the Nanoparticles by $CO/CO_2$ Adsorption Studies Followed by FTIR", Journal of Materials Chemistry, vol. 18, pp. 3325-3331, XP002588233, (2008).

International Search Report issued Jul. 12, 2010 in PCT/EP09/064584 filed Nov. 4, 2009.

U.S. Appl. No. 13/884,495, filed May 9, 2013, Seiger, et al.

U.S. Appl. No. 14/348,948, filed Apr. 1, 2014, Steiger, et al.

\* cited by examiner

FORMULATIONS COMPRISING A MIXTURE OF ZNO CUBANES AND PROCESS USING THEM TO PRODUCE SEMICONDUCTIVE ZNO LAYERS

The present invention relates to formulations comprising a mixture of ZnO cubanes, to processes for producing semiconductive ZnO layers in which these formulations are used, to the ZnO layers obtainable by this process, to the use of the formulations for producing electronic components and to electronic components comprising the ZnO layers produced by the process.

Owing to the low production costs and easy scalability, printed electronics is at the focus of many current research and development projects, especially in the field of semiconductor technology. An electronic circuit is inconceivable without field-effect transistors (FETs), which, in the case of printed electronics, can be classified as thin-film field-effect transistors (TFTs).

An important component in every transistor is the semiconductor material, which influences the switching parameters, for example the voltage. Important parameters for semiconductor materials are the particular field effect mobilities, processibilities and processing temperatures in the course of production.

Owing to its properties which are similar to those of gallium nitride, and owing to its simple and inexpensive preparation, zinc oxide is one of the most attractive inorganic oxide materials for transistor production. In addition, zinc oxide, owing to its highly interesting piezoelectric and electromechanical properties, is also often used in semiconductor technology in general (Mater. Sci. Eng. B-Solid State Mater. Adv. Technol. 2001, 80, 383; IEEE Trans. Microw. Theory Tech. 1969, MT17, 957), and in electronics and optoelectronics. Owing to its band gap of 3.37 eV at room temperature (Klingshirn, Phys. Status Solidi B, 1975, 71, 547) and its high exciton binding energy of 60 meV (Landolt-Börnstein New Series, Group III Vol. 41 B), zinc oxide also has other widespread applications, such as in laser technology at room temperature.

The Hall mobility $\mu_H$ of the electrons in the ZnO single crystal is 400 $cm^2 \cdot V^{-1} \cdot s^{-1}$, though these values have not been achieved to date in layers produced in practical tests. ZnO layers deposited or sputtered by epitaxy, i.e., for example, by means of chemical vapour deposition (CVD), exhibit FET mobilities of 50 to 155 $cm^2 \cdot V^{-1} \cdot s^{-1}$. Owing to the advantages of printing processes already mentioned, it would thus be desirable to be able to produce ZnO layers with maximum charge carrier mobilities suitable for use in circuits by means of printing processes.

One demand on systems for printed electronics, where most currently known ZnO production technologies fail, is the desired low processing temperature. This should be below 300° C. in order to be suitable for flexible polymer-based substrates.

In principle, there are two means of realizing printed electronics: particle concepts and precursor concepts.

Particle-based concepts rely in particular on the use of nanoparticulate systems, for example ZnO nanotubes (Nano Letters, 2005, 5, 12, 2408-2413). The disadvantages of the particle concepts lie firstly in the colloidal instability of the particle dispersions used, which necessitates the use of dispersing additives, which can in turn adversely affect the resulting charge carrier mobility. Secondly, particle-particle resistance constitutes a problem since this reduces the mobility of charge carriers and generally increases the layer resistance.

For the precursor approach, it is possible in principle to use different $Zn^{2+}$ salts for ZnO synthesis, for example $ZnCl_2$, $ZnBr_2$, $Zn(OAc)_2$, other Zn salts of carboxylic acids, $Zn(NO_3)_2$ and $Zn(SO_4)_2$. In spite of the resulting good mobility values, such precursors, however, are unsuitable for printable electronics because the processing temperature is always well above 350° C. (see, for example, J. Am. Chem. Soc. 2007, 129, 2750-2751 for the decomposition of $Zn(OAc)_2$, or IEEE Trans., 54, 6, 2007, 1301-1307 for the decomposition of $ZnCl_2$). Use of chelate ligands, for example, allows the processing temperature to be reduced, but the use thereof is found to be disadvantageous for the resulting layers (DE 20 2005 010 697 U1). In contrast to the zinc salts listed, the easily industrially available dialkylzinc compounds, for example $Me_2Zn$ and $Et_2Zn$, are very reactive. Precisely for this reason, processing with them, however, is very complex, and there is thus a need for other ZnO precursors which have good suitability for printable electronics.

Even though the reaction between dialkylzinc compounds and alcohols has been known for more than 100 years, the elucidation of the structure of the products was not possible until the 1960s. Reaction of dialkylzinc with alcohols affords an alkoxyalkylzinc compound which is usually present in tetramer or cubane form $[RZn(OR')]_4$, even though, depending on the substituents, other oligomeric forms, especially $[RZn(OR')]_n$ where n=2-6, are also conceivable (J. Chem. Soc. 1965, 1870-1877; J. Chem. Soc. (B) 1966, 1020-1024; Chem. Comm. 1966, 194a). The cubanes can also be synthesized from the dialkyltin compounds by the reaction with oxygen and optionally water, which can also form dicubanes as well as the monocubanes (Inorg. Chem. 2007, 46, 4293-4297).

The ZnO cubanes find use in organic synthesis, for example in alcohol dehydratation (J. Org. Chem. 1979, 44(8), 1221-1232), as polymerisation initiators for β-propiolactones, and as precursors for ZnO in methanol synthesis (J. Am. Chem. Soc. 2005, 127, 12028-12034), in the preparation of ZnO by means of chemical vapour synthesis (MOCVD; J. Mater. Chem. 1994, 4(8), 1249-1253), and in the synthesis of ZnO nanoparticles by means of solvothermal pyrolysis or CVD (WO 03/014011 A1; Smll 2005, 1(5), 540-552).

JP 07-182939 A describes the production of transparent ZnO films from solutions of compounds of the $[R^1Zn(OR^2)]_4$ type in an organic solvent, which are producible essentially by applying the solution to a substrate and thermally curing ($R^1=R^2$=alkyl, aryl, aralkyl).

The described conversion of ZnO cubanes to ZnO leads to a change in the film morphology. However, it has been difficult to date to obtain homogeneous films with good electron mobilities even at low processing temperatures.

It is thus an object of the present invention, with respect to the known prior art, to provide systems with which the existing approaches to the production of ZnO from precursor-based systems can be improved to the effect that homogeneous, continuous ZnO layers with high electron mobilities result even at low processing temperatures.

The present object is achieved by a formulation comprising a) at least two different ZnO cubanes of which i) at least one ZnO cubane is present in solid form under SATP conditions (SATP='standard ambient temperature and pressure'; 25° C. and $10^5$ Pa) and ii) at least one ZnO cubane is present in liquid form under SATP conditions, and b) at least one solvent.

As already stated above, the ZnO cubanes in the inventive formulation can each be described by the generic formula $[R^1Zn(OR^2)]_4$. In this formula, $R^1$ and $R^2$ may each independently be alkyl, aryl, aralkyl, alkyloxyalkyl, aryloxyalkyl or aralkyloxyalkyl, especially substituted or unsubstituted $C_1$-$C_{10}$-alkyl, substituted or unsubstituted $C_6$-$C_{14}$-aryl, substituted or unsubstituted aralkyl with a substituted or unsubstituted $C_6$-$C_{14}$-aryl group and one or more substituted or unsubstituted $C_1$-$C_{10}$-alkyl groups, substituted or unsubstituted $C_1$-$C_{10}$-alkyloxy-$C_1$-$C_{10}$-alkyl or substituted or unsubstituted $C_6$-$C_{14}$-aryloxy-$C_1$-$C_{10}$-alkyl, each with the proviso that the ZnO cubanes further differ in that they are solid or liquid under SATP conditions.

It has been found that, surprisingly, the object underlying this invention cannot be achieved by a formulation comprising only one ZnO cubane. For instance, formulations comprising only one ZnO cubane which is liquid under SATP conditions provide very homogeneous films, but they have to be converted at comparatively high temperatures, and the performance of the resulting ZnO layer in the component is relatively low ($\mu_{FET}=2\times10^{-4}$ cm$^2$/Vs). In contrast, formulations comprising only one ZnO cubane which is solid under SATP conditions do not provide homogeneous films and hence no functioning components either.

Compared to this, it was found that formulations comprising one ZnO cubane which is liquid under SATP conditions and one ZnO cubane which is solid under SATP conditions are not only processable at low temperatures and then provide homogeneous films with good electron mobilities, but that layers produced using them even have higher electron mobilities than the layers produced on the basis of ZnO cubanes liquid under SATP conditions.

The ZnO cubane present in solid form under SATP conditions has a decomposition or melting point of >25° C. at a pressure of $10^5$ Pa. It is also possible to use those ZnO cubanes which are present in solid form and cannot be converted to the liquid phase by a melting operation, but which decompose directly from the solid state. ZnO cubanes which are present in solid form and are useable with preference have, at this pressure, a decomposition point in the range of 120-300° C., more preferably in the range of 150-250° C. In a mixture with ZnO cubanes liquid under SATP conditions, such ZnO cubanes surprisingly lead to particularly good film formation and can nevertheless be processed at low temperature.

Preferred ZnO cubanes present in solid form under SATP conditions can be represented by the generic formula $[R^1Zn(OR^2)]_4$ in which $R^1$=Me or Et and $R^2$=t-Bu or i-Pr. The ZnO cubane present in solid form under SATP conditions is more preferably a compound selected from [MeZn(O-t-Bu)]$_4$ and [MeZn(O-i-Pr)]$_4$.

The ZnO cubane present in liquid form under SATP conditions has, at $10^5$ Pa, a melting point of <25° C. At this pressure, it more preferably has a melting point in the range from 25 to –100° C., more preferably a melting point in the range from 0 to –30° C. It has been found that, surprisingly, the lower-melting the ZnO cubane used, the better the homogeneity of the resulting layer.

Preferred ZnO cubanes present in liquid form under SATP conditions can be represented by the generic formula $[R^1Zn(OR^2)]_4$ in which $R^1$=Me or Et and $R^2$=CH$_2$CH$_2$OCH$_3$, CH$_2$CH$_2$OCH$_2$CH$_3$, CH$_2$OCH$_2$CH$_3$, CH$_2$OCH$_3$ or CH$_2$CH$_2$CH$_2$OCH$_3$. The ZnO cubane present in liquid form under SATP conditions is more preferably [MeZn(OCH$_2$CH$_2$OCH$_3$)]$_4$.

The at least one ZnO cubane which is solid at standard pressure is present in the inventive formulation preferably in proportions of 10 to 90% by weight, preferably of 30 to 70% by weight, most preferably of 40 to 60% by weight, based on the total mass of solid and liquid ZnO cubane. The more the particular percentages by weight of solid and liquid ZnO cubanes based on their total mass approximate to a value of 50% by weight, the more homogeneous and the better the performances in the component of the corresponding ZnO films. The optimal result is for formulations containing 50% by weight (based on the total mass of ZnO cubane) of ZnO cubane which is solid at standard pressure and 50% by weight (based on the total mass of ZnO cubane) of ZnO cubane which is liquid at standard pressure: this gives a particularly homogeneous film which also provides a particularly good performance in the component ($\mu_{FET}=10^{-3}$ cm$^2$/Vs).

The formulation further contains at least one solvent. The formulation may comprise either at least one solvent or a mixture of different solvents. Useable with preference in the inventive formulation are aprotic solvents, i.e. those selected from the group of the aprotic nonpolar solvents, i.e. the alkanes, substituted alkanes, alkenes, alkynes, aromatics without or with aliphatic or aromatic substituents, halogenated hydrocarbons, tetramethylsilane, or the group of the aprotic polar solvents, i.e. the ethers, aromatic ethers, substituted ethers, esters or acid anhydrides, ketones, tertiary amines, nitromethane, DMF (dimethylformamide), DMSO (dimethylsulphoxide) or propylene carbonate. Solvents useable with particular preference are toluene, xylene, anisole, mesitylene, n-hexane, n-heptane, tris-(3,6-dioxaheptyl) amine (TDA), 2-aminomethyltetrahydrofuran, phenetole, 4-methylanisole, 3-methylanisole, methyl benzoate, N-methyl-2-pyrrolidone (NMP), tetralin, ethyl benzoate and diethyl ether.

The concentration of the ZnO cubanes in the formulation is preferably 5-60, more preferably 10-50 and most preferably 20-40% by weight, based on the formulation.

The inventive formulation is outstandingly suitable for producing ZnO layers without any need to add further additives for that purpose. Nevertheless, the inventive formulations are compatible with various additives, for example substances which stabilize the former against reagglomeration and sedimentation. In general, this at least one additive, depending on the type, the zinc oxide concentration and the type of liquid phase of the dispersion, may be present in a proportion of 0.01 to 20% by weight, based on the ZnO cubanes present in the formulation. In general, a low proportion of the substances will be desirable, since this can have positive effects on the performance of the electronic component. Particularly suitable additives are:

I) Styrene oxide-based polyalkylene oxide with random distribution or as a block copolymer of the general formula (1), $$R^1O(SO)_a(EO)_b(PO)_c(BO)_dR^2 \quad (1)$$

where
$R^1$=a straight-chain or branched or cycloaliphatic radical having 8 to 13 carbon atoms,
$R^2$=hydrogen, an acyl radical, alkyl radical or carboxylic acid radical having in each case 1 to 8 carbon atoms,
SO=styrene oxide, EO=ethylene oxide, PO=propylene oxide,
BO=butylene oxide and
a=1 to 5,
b=3 to 50,
c=0 to 3,
d=0 to 3, where b≥a+c+d.

Compounds where a=1 to 1.9 are described, for example, in EP-A-1078946.

II) A phosphoric ester of the general formula (2)

(2)

where R= where
x=1 or 2,
n=2 to 18,
m, o=2 to 100,
k=2 to 4,
R''=H or a linear or branched alkyl radical which may optionally be substituted by additional functional groups, and
R'=alkyl, alkaryl, alkenyl or sulphopropyl radical.

Compounds used with preference are described, for example, in EP-A-940406.

III) In addition, it is possible to use block copolymers and salts thereof of the general formula (3)

$$[R^1O(SO)_a(EO)_b(CH_2CHCH_3O)_c(BO)_d]_xP(=O)(OH)_{3-x} \quad (3)$$

where
$R^1$=a straight-chain, branched or cycloaliphatic radical having 1 to 22 carbon atoms,
SO=styrene oxide, EO=ethylene oxide, BO=butylene oxide and
a=1 to <2,
b=0 to 100,
c=0 to 10,
d=0 to 3, where b a+c+d.

IV) In addition, it is possible to use compounds which are obtainable by the partial or complete reaction of:

A) one or more amino-functional polymers with
B) one or more polyesters of the general formulae (4)/(4a)

$$T-C(O)-[O-A-C(O)]_x OH \quad (4), \quad T-O-[C(O)-A-O-]_y-Z \quad (4a)$$

and

C) one or more polyethers of the general formula (5)/(5a)

$$T-C(O)-B-Z \quad (5), \quad T-O-B-Z \quad (5a),$$

in which
T is a hydrogen radical and/or an optionally substituted, linear or branched aryl, arylalkyl, alkyl or alkenyl radical having 1 to 24 carbon atoms,
A is at least one divalent radical selected from the group of the linear, branched, cyclic and aromatic hydrocarbons,
Z is at least one radical selected from the group of the sulphonic acids, sulphuric acids, phosphonic acids, phosphoric acids, carboxylic acids, isocyanates, epoxides, especially phosphoric acid and (meth)acrylic acid,
B is a radical of the general formula (6)

$$-(C_lH_{2l}O)_a-(C_mH_{2m}O)_b-(C_nH_{2n}O)_c-(SO)_d- \quad (6)$$

a, b, c are each independently values of 0 to 100, with the proviso that the sum of a+b+c is ≥0, preferably 5 to 35, especially 10 to 20, with the proviso that the sum of a+b+c+d>0,
d is ≥0, preferably 1 to 5,
l, m, n are each independently ≥2, preferably 2 to 4,
x, y are each independently ≥2.

V) In addition, it is possible to use organopolysiloxanes of the general formula (7) where the radicals (7)

$R^1$ are alkyl radicals having 1 to 4 carbon atoms or aryl radicals, but at least 80% of the $R^1$ radicals are methyl radicals,
$R^2$ in the molecule are the same or different and may be defined as follows a)

in which
$R^3$ is a hydrogen or alkyl radical,
$R^4$ is a hydrogen, alkyl or carboxyl radical,
c is from 1 to 20, d is from 0 to 50,
e is from 0 to 50,
or
b) —(CH$_2$—)$_e$OR$^5$ in which
R$^5$ is a hydrogen, alkyl, carboxyl or radical, or a dimethylolpropane radical optionally containing ether groups,
f is from 2 to 20 or
c) —(CH$_2$—)$_g$(OC$_2$H$_4$—)$_h$(OC$_3$H$_6$—)$_i$(OC$_4$H$_8$)$_j$(OCH$_2$CH(C$_6$H$_5$))$_k$OR$^6$ in which
R$^6$ is a hydrogen, alkyl or carboxyl radical,
g is from 2 to 6,
h is from 0 to 20,
i is from 1 to 50,
j is from 0 to 10,
k is from 0 to 10
or
d) corresponds to the R$^1$ radical, with the proviso that, in the average molecule, at least one R$^2$ radical is defined as (a), where a is from 1 to 500, preferably 1 to 200 and especially 1 to 50, and b is from 0 to 10, preferably <5 and especially 0.

Such compounds are described, for example, in EP-A-1382632.

VI) In addition, it is possible to use copolymers based on styrene oxide-based oxyalkylene glycol alkenyl ethers or polyalkylene oxide alkenyl ethers and unsaturated carboxylic acid derivatives, preferably dicarboxylic acid derivatives, with
a) 1 to 80 mol % of at least one of the constituent groups of the formula (8a), (8b), (8c) and/or (8d)

(8a)

(8b)

(8c)

(8d)

in which
R$^1$=H, aliphatic hydrocarbon radical having 1 to 5 carbon atoms,
p=1-4, q=0-6, t=0-4, i=1-6, l=1-2, m=2-18,
where the index on the hydrogen atom is formed by the product of l and m,
n=0-100, o=0-100, SO=styrene oxide,
where (SO)$_i$ and the alkylene oxide derivatives may be in random or blockwise distribution in the polyether, but the groups are preferably present in blockwise structure and in the sequence R$^2$=H, an aliphatic, optionally branched hydrocarbon radical having 1 to 20 carbon atoms, a cycloaliphatic hydrocarbon having 5 to 8 carbon atoms, an aryl radical which has 6 to 14 carbon atoms and is optionally substituted, or may be a phosphoric ester (preferably monoester), sulphate or sulphonate derivative.

b) 1 to 90 mol % of constituent groups of the formula (9)

(9)

where
S=—H, —COOM$_a$, —COOR$^3$,
M=hydrogen, mono- or divalent metal cation, ammonium ion, organic amine radical,
a=1 or, in the case that M is a divalent metal cation, ½,
R$^3$=an aliphatic, optionally branched hydrocarbon radical having 1 to 20 carbon atoms, a cycloaliphatic hydrocarbon having 5 to 8 carbon atoms, an aryl radical having 6 to 14 carbon atoms,
T=—U$^1$—R$^4$ or —U$^1$—(C$_m$H$_{lm}$O)$_n$—(C$_m$H$_{lm}$O)$_o$R$^2$,
U$^1$=—COO—, —CONH—, —CONR$^3$—, —O—, —CH$_2$O—,
R$^4$=H, M$_a$, R$^3$ or -Q$^1$-NQ$^2$Q$^3$,
where
Q$^1$ is a divalent alkylene radical having 2 to 24 carbon atoms,
Q$^2$ and Q$^3$ are each aliphatic and/or alicyclic alkyl radicals having 1 to 12 carbon atoms, optionally oxidized to

-Q$^1$-N(+)O(-)Q$^2$Q$^3$ and
m, n, l, o, R$^1$ and R$^2$ are each as defined above,
c) 0 to 10 mol % of constituent groups of the formula (10)

(10)

where
T$^1$=—U$^1$—(C$_m$H$_{lm}$O)$_n$—(C$_m$H$_{lm}$O)$_o$—R$^5$, where U$^2$=—OOC—, —NHOC—, —O—, —O—CH$_2$—,
where m, n, l, o, S, R$^1$, R$^2$ and U$^1$ are each as defined above.

Such compounds are described, for example, in DE-A-10348825.

(VII) In addition, it is possible to use polyacrylic acids having a weight-average molecular weight M$_w$ of preferably 200 to 2 000 000 g/mol, more preferably an M$_w$ of 1000 to 50 000 g/mol, and salts thereof.

The inventive formulation can also be used not only directly, with or without addition of additives, to produce ZnO layers, but the formulation can also be used embedded into matrix formers, for example PMMA, polystyrene, PP, PE, PC or PVC, for the ZnO layer production.

The invention further provides a process for producing a semiconductive ZnO layer, in which an inventive formulation is applied to a substrate and then thermally converted, and to the ZnO layers producible by this process.

The substrate may be an Si or Si/SiO$_2$ wafer, a glass substrate or a polymer substrate, the latter especially based on PET, PE, PEN, PEI, PEEK, PI, PC, PEA, PA or PP.

The inventive formulation can be applied to the substrate by spin-coating, spraying or various printing processes (flexographic printing, gravure printing, inkjet printing, screen printing, pad printing or offset printing).

The thermal conversion is effected preferably at temperatures of 120 to 450° C., more preferably 150 to 400° C. The thermal conversion can be effected by the use of hotplates, ovens, lasers and UV and/or microwave radiation.

After the thermal conversion, the ZnO layer produced from the inventive formulation can be aftertreated. For instance, the properties of the ZnO layer produced can be improved still further by an aftertreatment with reducing or oxidizing atmospheres, or by means of moisture, plasma treatment, laser treatment, UV irradiation.

The inventive ZnO cubane formulations can thus be used for producing electronic components. More particularly, the inventive ZnO cubane formulations are suitable for the production of transistors, optoelectronic components and piezoelectric sensors.

The present invention thus likewise provides an electronic component, especially a transistor, an optoelectronic component and a piezoelectric sensor, each of which comprises at least one semiconductive ZnO layer which has been produced by the above-described processes.

EXAMPLES

Example 1

A 50/50% by weight mixture of a ZnO cubane which is liquid under SATP conditions ([MeZn(OCH$_2$CH$_2$OCH$_3$)]$_4$, 400 mg) and of a ZnO cubane which is solid under SATP conditions ([MeZn(O-t-Bu)]$_4$, 400 mg) in 2 ml of toluene is applied to an Si/SiO$_2$ substrate by spin-coating (2000 rpm, 30 s), and baked at 400° C. in a forced-air oven.

Figure 1A:
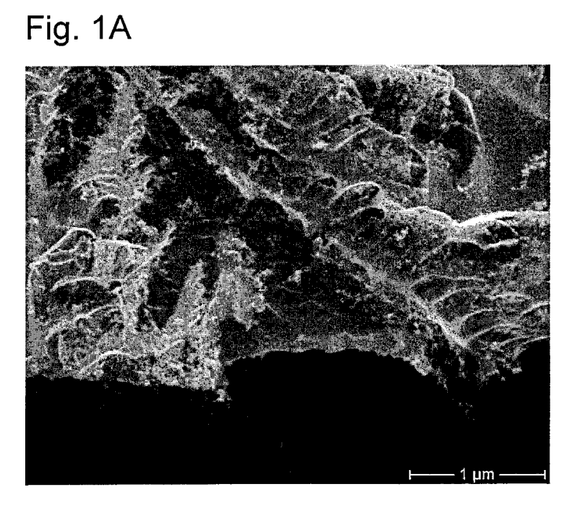
FIG. 1A is a ZnO layer formed from mixture obtained at 400° C.
Figure 1B:
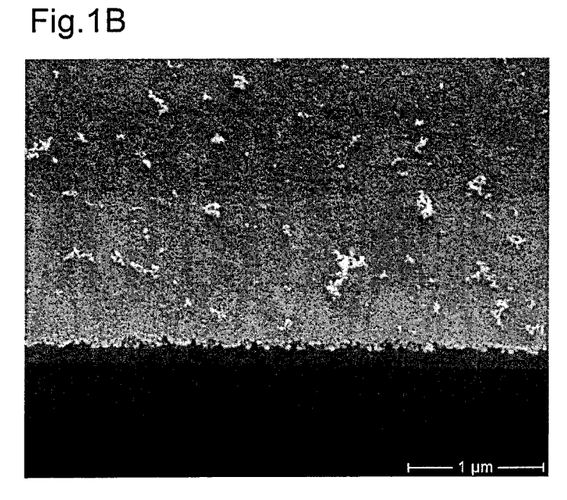
FIG. 1B is a ZnO layer formed from liquid ZnO cubane obtained at 400° C.
Figure 1C:
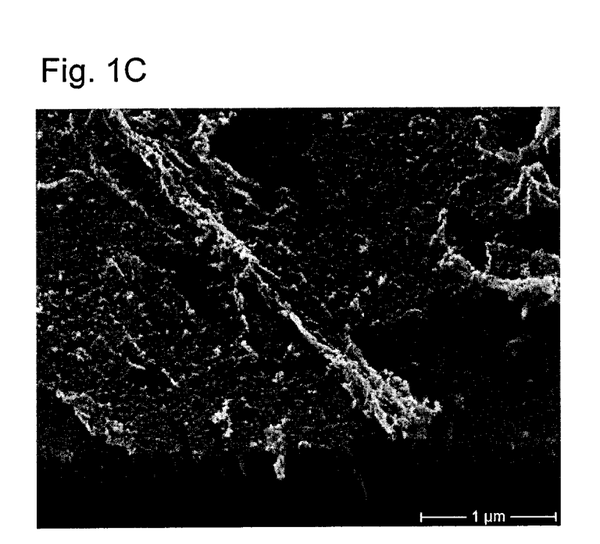
FIG. 1C is an inhomogeneous layer formed from solid ZnO cubane at 400° C.

Table 1 shows better performance values of the resulting ZnO layer in the TFT compared to a ZnO layer which was produced under the same conditions from a solution which contains only the liquid cubane and is of the same concentration in relation to the amount of cubane. Microscope images of the resulting layers are shown by FIGS. 1A-1C (SEM recording conditions: Hitachi S-4000 microscope equipped with an SAMX EDX detector without pretreatment, microscope analyses at room temperature and atmospheric pressure). A solution containing only the solid cubane which was processed under the same conditions and is of the same concentration in relation to the amount of cubane, as is evident from FIG. 1C does not form a homogeneous layer; performance values thus cannot be determined there.

Example 2

A 50/50% by weight mixture of a ZnO cubane which is liquid under SATP conditions ([MeZn(OCH$_2$CH$_2$OCH$_3$)]$_4$, 400 mg) and of a ZnO cubane which is solid under SATP conditions ([MeZn(O-t-Bu)]$_4$, 400 mg) in 2 ml of toluene is applied to an Si/SiO$_2$ substrate by spin-coating (2000 rpm, 30 s), and baked at 300° C. in a forced-air oven.

Figure 2A:
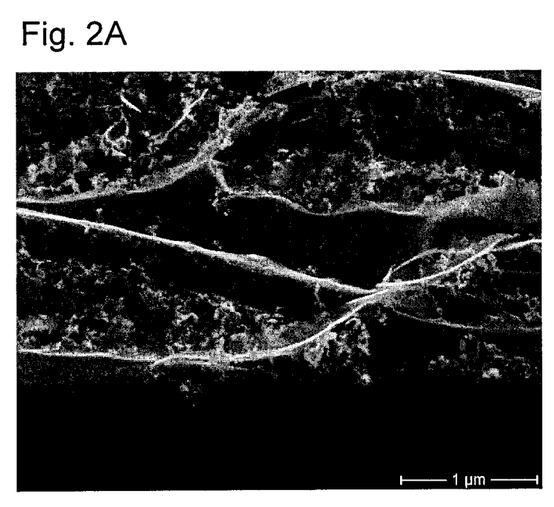
FIG. 2A is a ZnO layer formed from mixture obtained at 300° C.
Figure 2B:
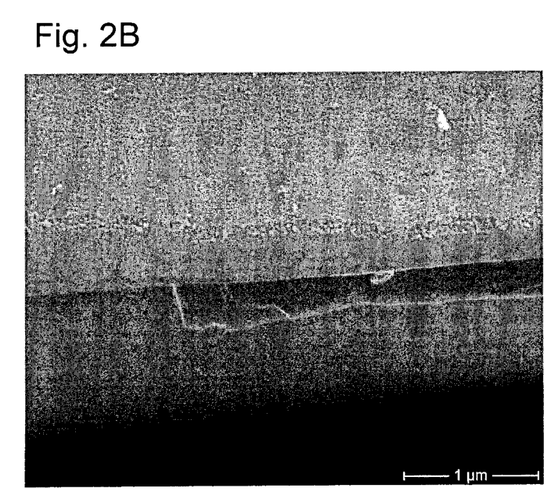
FIG. 2B is a ZnO layer formed from liquid ZnO cubane obtained at 300° C.
Figure 2C:
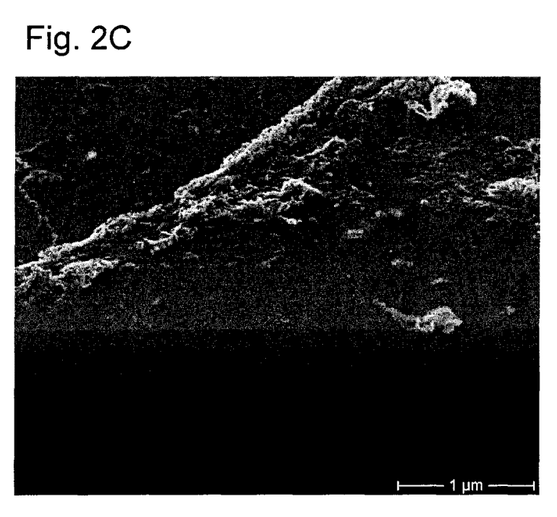
FIG. 2C is an inhomogeneous layer formed from solid ZnO cubane at 300° C.

Table 1 shows better performance values of the resulting ZnO layer in the TFT compared to a ZnO layer which was produced under the same conditions from a solution which contains only the liquid cubane and is of the same concentration in relation to the amount of cubane. Microscope images of the resulting layers are shown by FIGS. 2A-2C (SEM recording conditions: Hitachi S-4000 microscope equipped with an SAMX EDX detector without pretreatment, microscope analyses at room temperature and atmospheric pressure). A solution containing only the solid cubane which was processed under the same conditions and is of the same concentration in relation to the amount of cubane, as is evident from FIG. 2C does not form a homogeneous layer; performance values thus cannot be determined there.

Example 3

A 50/50% by weight mixture of a ZnO cubane which is liquid under SATP conditions ([MeZn(OCH$_2$CH$_2$OCH$_3$)]$_4$, 400 mg) and of a ZnO cubane which is solid under SATP conditions ([MeZn(O-t-Bu)]$_4$, 400 mg) in 2 ml of toluene is applied to an Si/SiO$_2$ substrate by spin-coating (2000 rpm, 30 s), and baked at 200° C. in a forced-air oven.

Figure 3A:
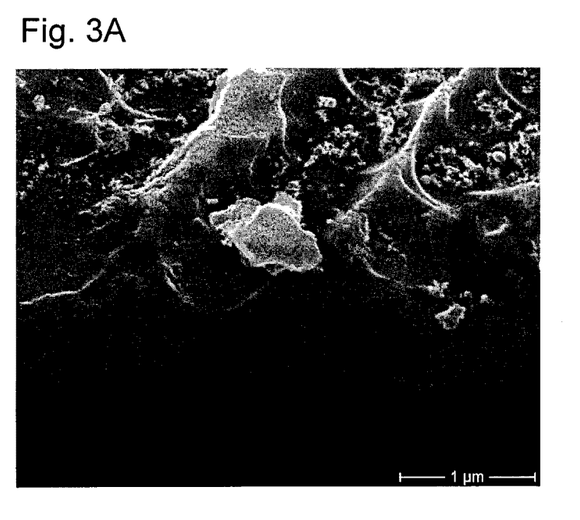
FIG. 3A is a ZnO layer formed from mixture obtained at 200° C.
Figure 3B:
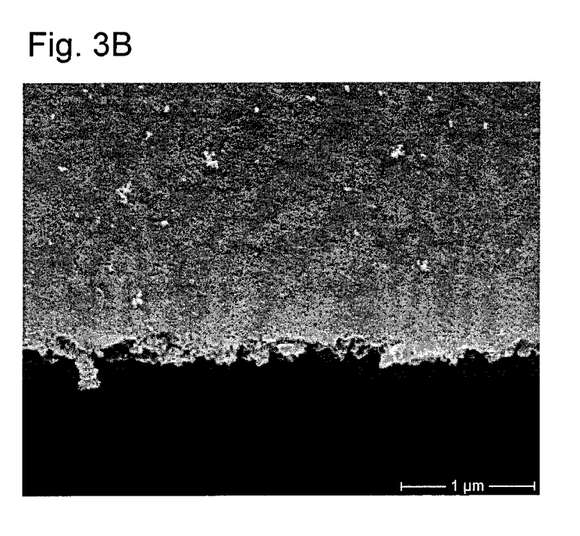
FIG. 3B is a ZnO layer formed from liquid ZnO cubane obtained at 200° C.
Figure 3C:
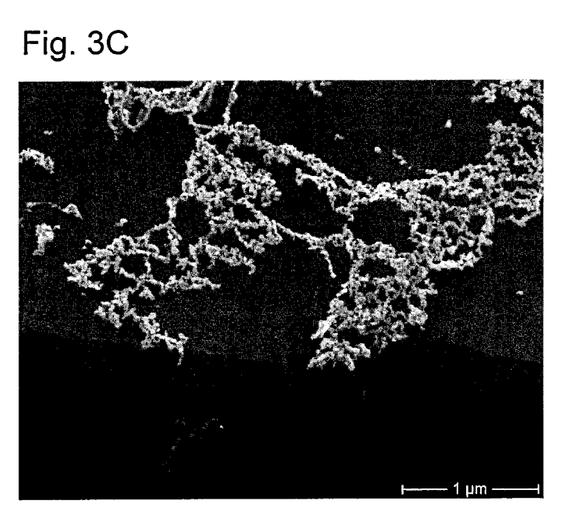
FIG. 3C is an inhomogeneous layer formed from solid ZnO cubane at 200° C.

Table 1 shows better performance values of the resulting ZnO layer in the TFT compared to a ZnO layer which was produced under the same conditions from a solution which contains only the liquid cubane and is of the same concentration in relation to the amount of cubane. Microscope images of the resulting layers are shown by FIGS. 3A-3C (SEM recording conditions: Hitachi S-4000 microscope equipped with an SAMX EDX detector without pretreatment, microscope analyses at room temperature and atmospheric pressure). A solution containing only the solid cubane which was processed under the same conditions and is of the same concentration in relation to the amount of cubane, as is evident from FIG. 3C does not form a homogeneous layer; performance values thus cannot be determined there.

TABLE 1

| $\mu_{FET}$ ($10^{-4}$ cm$^2$/Vs) | Mixture of solid/liquid ZnO cubane | Only liquid ZnO cubane | Only solid ZnO cubane |
|---|---|---|---|
| 400° C. | 10 | 2 | not measurable |
| 300° C. | 300 | 6 | not measurable |
| 200° C. | 60 | 3 | not measurable |

The invention claimed is:

1. A formulation comprising
   a) at least two different ZnO cubanes of which
      i) at least one ZnO cubane is present in solid form under SATP conditions and
      ii) at least one ZnO cubane is present in liquid form under SATP conditions, and
   b) at least one solvent.

2. A formulation according to claim 1, wherein the ZnO cubane present in solid form under SATP conditions, at 10$^5$ Pa, has a decomposition point of 120-300° C.

3. A formulation according to claim 1, wherein the ZnO cubane present in solid form under SATP conditions is a ZnO cubane of the generic formula [R$^1$Zn(OR$^2$)]$_4$ where R$^1$=Me or Et and R$^2$=t-Bu or i-Pr.

4. A formulation according to claim 1, wherein the ZnO cubane present in liquid form under SATP conditions, at standard pressure, has a melting point of 25 to −100° C.

5. A formulation according to claim 1, wherein the ZnO cubane present in liquid form under SATP conditions is a ZnO cubane of the generic formula [R$^1$Zn(OR$^2$)]$_4$ where R$^1$=Me or Et and R$^2$=CH$_2$CH$_2$OCH$_3$, CH$_2$CH$_2$OCH$_2$CH$_3$, CH$_2$OCH$_2$CH$_3$, CH$_2$OCH$_3$ or CH$_2$CH$_2$CH$_2$OCH$_3$.

6. A formulation according to claim 1, wherein the at least one ZnO cubane which is solid at standard pressure is present in proportions of 10 to 90% by weight based on the total mass of solid and liquid ZnO cubane.

7. A formulation according to claim 1, wherein the at least one solvent is an aprotic solvent.

8. A formulation according to claim 1, wherein the concentration of the ZnO cubanes is 5-60 based on the formulation.

9. A formulation according to claim 1, further comprising 0.1-20% by weight of at least one additive based on the ZnO cubanes present in the formulation.

10. A process for producing a semiconductive ZnO layer, wherein a formulation according to claim 1 is applied to a substrate and then thermally converted.

11. A formulation according to claim 3, wherein the ZnO cubane present in solid form under SATP conditions is [MeZn(O-t-Bu)]$_4$ or [MeZn(O-i-Pr)]$_4$.

12. A formulation according to claim 5, wherein the ZnO cubane present in liquid form under SATP conditions is [MeZn(OCH$_2$CH$_2$OCH$_3$)]$_4$.

13. A formulation according to claim 7, when the aprotic solvent is at least one solvent selected from the group consisting of toluene, xylene, anisole, mesitylene, n-hexane, n-heptane, tris-(3,6-dioxaheptyl)amine (TDA), 2-aminomethyltetrahydrofuran, phenetole, 4-methylanisole, 3-methylanisole, methyl benzoate, N-methyl-2-pyrrolidone (NMP), tetralin, ethyl benzoate and diethyl ether.

14. The process according to claim 10, wherein the substrate is an Si or Si/SiO$_2$ wafer, a glass substrate or a polymer substrate.

15. A process according to claim 10, wherein the formulation is applied to the substrate by spin-coating, spraying, flexographic printing, gravure printing, inkjet printing, screen printing, pad printing or offset printing.

16. A process according to claim 10, wherein the thermal conversion is effected at temperatures of 120 to 450° C.

17. A process according to claim 10, wherein the semiconductive ZnO layer is aftertreated by at least one process selected from the group consisting of an aftertreatment with reducing or oxidizing atmospheres, treatment with moisture, plasma treatment, laser treatment and UV irradiation.

18. An electronic component comprising at least one semiconductive ZnO layer which has been produced by one of the processes according to claim 12.

19. The process according to claim 10, wherein the substrate is a polymer substrate based on PET, PE, PEN, PEI, PEEK, PI, PC, PEA, PA or PP.

20. A transistor comprising at least one semiconductive ZnO layer produced according to the process of claim 18.

21. An optoelectronic component comprising at least one semiconductive ZnO layer which has been produced according to the process of claim 18.

22. A sensor comprising at least one semiconductive ZnO layer which has been produced according to the process of claim 18.

* * * * *